United States Patent
Fukaya et al.

(10) Patent No.: US 9,188,852 B2
(45) Date of Patent: Nov. 17, 2015

(54) PHOTOMASK BLANK, METHOD FOR MANUFACTURING PHOTOMASK, AND METHOD FOR MANUFACTURING PHASE SHIFT MASK

(71) Applicant: Shin-Etsu Chemical Co., Ltd., Tokyo (JP)

(72) Inventors: Souichi Fukaya, Niigata (JP); Hideo Nakagawa, Niigata (JP); Kouhei Sasamoto, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 184 days.

(21) Appl. No.: 13/892,557

(22) Filed: May 13, 2013

(65) Prior Publication Data
US 2013/0309601 A1    Nov. 21, 2013

(30) Foreign Application Priority Data

May 16, 2012 (JP) ................................ 2012-112516

(51) Int. Cl.
*G03F 1/26* (2012.01)
*G03F 1/30* (2012.01)
*G03F 1/54* (2012.01)
*G03F 1/80* (2012.01)

(52) U.S. Cl.
CPC .. *G03F 1/26* (2013.01); *G03F 1/30* (2013.01); *G03F 1/54* (2013.01); *G03F 1/80* (2013.01)

(58) Field of Classification Search
CPC ....................................................... G03F 1/26
USPC ............................................ 430/5, 322, 323
See application file for complete search history.

(56) References Cited

U.S. PATENT DOCUMENTS

| 2006/0088774 A1 | 4/2006 | Yoshikawa et al. |
| 2006/0154153 A1 | 7/2006 | Chiang |
| 2006/0251973 A1 | 11/2006 | Takaki |
| 2007/0134568 A1* | 6/2007 | Ushida ............................. 430/5 |

(Continued)

FOREIGN PATENT DOCUMENTS

| CN | 1763632 A | 4/2006 |
| JP | 61-138257 | 6/1986 |

(Continued)

OTHER PUBLICATIONS

Extended European Search Report issued Sep. 6, 2013, in Patent Application No. 13167562.1.

(Continued)

*Primary Examiner* — Stephen Rosasco
(74) *Attorney, Agent, or Firm* — Oblon, McClelland, Maier & Neustadt, L.L.P.

(57) ABSTRACT

A light-shielding film 2 formed on a transparent substrate 1 has a monolayer structure or a multilayer structure. At least one layer is formed by film-formation with a chromium-containing material including tin. The light-shielding film 2 has an optical density of 2 or higher and 4 or lower and has a reflection-preventing function. The layer made of a chromium-containing material including tin, which constitutes the light-shielding film 2, can cause a significant increase in the etching rate at the time of chlorine-containing dry etching including oxygen. Thus, burden on the resist pattern or hard mask pattern at the time of transferring a pattern on the light-shielding film is reduced, and therefore it is possible to carry out pattern transfer with high precision.

9 Claims, 7 Drawing Sheets

(56) References Cited

U.S. PATENT DOCUMENTS

| | | |
|---|---|---|
| 2008/0063950 A1 | 3/2008 | Yoshikawa |
| 2008/0305406 A1 | 12/2008 | Kominato et al. |
| 2010/0173234 A1 | 7/2010 | Okubo |

FOREIGN PATENT DOCUMENTS

| | | |
|---|---|---|
| JP | 63-58446 | 3/1988 |
| JP | 2006-48033 | 2/2006 |
| JP | 2006-78807 | 3/2006 |
| JP | 2006-146151 | 6/2006 |
| JP | 2007-33470 | 2/2007 |
| JP | 2009-80510 | 4/2009 |
| JP | 2009-92823 | 4/2009 |
| JP | 2010-9001 | 1/2010 |
| JP | 2011-164598 | 8/2011 |
| JP | 5367913 B2 | 12/2013 |
| WO | 2007/074806 A1 | 7/2007 |
| WO | WO 2012/043695 A1 | 4/2012 |
| WO | WO 2012/070209 A1 | 5/2012 |
| WO | WO 2012/086744 A1 | 6/2012 |

OTHER PUBLICATIONS

Office Action issued Mar. 31, 2015 in Japanese Patent Application No. 2012-112516.

Office Action and Search Report dated Aug. 19, 2015 issued in corresponding Chinese patent application No. 201310182376.4.

* cited by examiner

PHOTOMASK BLANK, METHOD FOR MANUFACTURING PHOTOMASK, AND METHOD FOR MANUFACTURING PHASE SHIFT MASK

CROSS REFERENCES TO RELATED APPLICATIONS

This application claims priority to Japanese Patent Application No. 2012-112516, filed on May 16, 2012.

TECHNICAL FIELD

The present invention relates to a photomask blank for a photomask used in manufacture of a semiconductor integrated circuit or the like. More specifically, the present invention relates to a binary mask blank and a method for manufacturing a photomask using such a mask blank.

BACKGROUND ART

A microfabrication technique is a very important basic technique in the field of semiconductor technology, and the research and development thereof have been progressed for further finer microfabrication. In recent years, particularly, with high integration of a large scale integration circuit, refinement of circuit patterns, wiring patterns, or contact-hole patterns for wiring between layers forming a cell has been progressed, and a request for microfabrication technology has been increased.

In connection with this, even in the field of technology for photomask production to be used in the process for photolithography in microfabrication, a technique for forming fine and correct circuit patterns (mask patterns) has begun to be demanded.

In order to high-precision processing by lithography technology, the precondition is to form a photomask pattern with high precision. Generally, reduction projection is performed when forming a pattern on a semiconductor substrate by photolithographic technique. The size of the pattern formed on the photomask is therefore approximately four times larger than the side of the pattern formed on the semiconductor substrate. However, this does not mean that the desired precision of the pattern formed on the photomask is smaller than the pattern formed on the semiconductor substrate. Rather, the precision of a pattern formed on the photomask as a master is desired to be higher more than an actual pattern obtained after exposure In today's photolithography technical field, the size of a circuit pattern to be drawn is considerably smaller than the wavelength of light to be used for exposure. Thus, in the case of forming a photomask pattern with a just four-times larger circuit pattern, light interference or the like, which is generated under exposure, influences on transfer of an original shape. As a result, the original shape cannot be transferred onto the photoresist film of a semiconductor substrate.

In some cases, therefore, a pattern formed on the photomask is made more complicated than an actual circuit pattern to reduce an effect of the above light interference or the like. The shape of such a pattern may be, for example, an actual circuit pattern subjected to optical proximity correction (OPC).

Hence, along with a decrease in size of a circuit pattern, a higher precision processing technique has been also desired in a lithographic technique for forming photomask patterns. Although lithography performance may be expressed in limiting resolution, as described above, the precision of a pattern formed on the photomask as a master is desired to be higher more than an actual pattern obtained after exposure. Thus, limiting resolution required for formation of a photomask pattern is almost equal to or higher than one required in lithography for forming a pattern on a semiconductor base.

In general, when forming a photomask pattern, a photoresist film is formed on the surface of the photomask blank in which a light-shielding film is mounted on a transparent substrate, and a pattern is then drawn (exposed) on the photoresist film by an electron beam. Subsequently, after obtaining a photoresist pattern after developing the exposed photoresist film, the light-shielding film is etched by using this photoresist pattern as a mask to obtain a light-shielding (film) pattern. The light-shielding (film) pattern thus obtained is served as a photomask pattern.

In this case, the above photoresist film should be thinned depending on the degree of fineness of the light-shielding pattern. This is because, when forming a fine light-shielding pattern while keeping the thickness of the photoresist film, the ratio (aspect ratio) of the thickness of the photoresist film to the size of the light-shielding pattern becomes large and causes troubles of failed pattern transfer, falling down or peeling off of the photoresist pattern, or the like due to deterioration of the shape of the photoresist pattern.

As a material of the light-shielding film mounted on the transparent substrate, many kinds of materials have so far been proposed. Among them, however, a chromium compound has been practically used because of much know-how on etching, for example.

Dry etching of a chromium-containing material film is generally performed by chlorine-containing dry etching. In many cases, however, chlorine-containing dry etching has a certain level of ability to etch an organic layer. Thus, in the case that a photoresist pattern is formed on a thin photoresist film and then used as a mask to etch a light-shielding film, the photoresist pattern is also etched too much to ignore by chlorine-containing dry etching. As a result, the proper photoresist pattern, which should be transferred to a light-shield film, cannot be correctly transferred to the light-shielding film.

In order to avoid such inconvenience, a photoresist material having excellent etching resistance has been requested. However, such a photoresist material has not been known yet. For this reason, to obtain a light-shielding (film) pattern having high resolution property, a light-shielding film material having higher processing accuracy is required.

For a light-shielding film having higher processing accuracy as compared with a conventional material an attempt to increase the etching rate of a light-shielding film is reported, the attempt allowing a chromium compound to contain only a certain amount of a light element.

For example, Patent Literature 1 (WO 2007/74806 A) discloses a technique for reducing photoresist film loss at the time of chlorine-containing dry etching by using a material mainly containing chromium (Cr) and nitrogen (N) and having an X-diffraction peak of substantially CrN(200) as a light-shielding film material to enhance a dry-etching rate.

Furthermore, Patent Literature 2 (JP 2007-33470 A) discloses the invention of a photomask blank where its composition, film thickness, and a laminated structure are suitably designed to obtain desired transmittance T and reflectance R while trying to increases a dry-etching rate by making the composition of a chromium-containing compound of the light-shielding film rich in light element and low in chromium composition as compared with the composition of the conventional film.

CITATION LIST

Patent Literatures

Patent Literature 1: WO 2007/74806 A
Patent Literature 2: JP 2007-33470 A
Patent Literature 3: JP 61-138257 A
Patent Literature 4: JP 2009-80510 A
Patent Literature 5: JP 2006-146151 A
Patent Literature 6: JP 2006-78807 A

SUMMARY OF THE INVENTION

Technical Program

However, the technique as described above, where a light element is added to a chromium-containing compound to suppress a decrease in thickness of a photoresist film by increasing the dry-etching rate of a light-shielding film, has the following disadvantage:

When using a light-shielding film in which a light element is added to a chromium-based compound, the light-shielding film should not only ensure its improved etching rate but also ensure predetermined optical containing characteristics because the light-shielding film is also served as an optical film.

For example, a decrease in optical density cannot be completely avoided when the addition of a light element is carried out to enhance an etching rate. In fact, therefore, the film should be thickened. In this case, even though the etching rate of the light-shielding film itself increases, the etching time is prolonged as the film thickness increases. Thus, an effect is unwillingly limited in view of shortening the total etching time.

As a method for processing a chromium-containing film with high precision, there is a known method in which a hard mask film made of a silicon-containing material is used as a process auxiliary film (see, for example, Patent Literature 3: JP 61-138257 A and Patent Literature 4: JP 2009-80510 A).

However, since the etching resistance of the silicon-containing material against chlorine-containing dry etching including oxygen is not sufficiently high, the hard mask film made of a silicon-containing material cannot be sufficiently thinned. When the hard mask film, which cannot be easily thinned, is used as a processing auxiliary film, under present circumstances, there is a limit on high-precision of pattern transfer because of burden or the like on the photoresist pattern at the time of patterning.

For these reasons, in order to manufacture a high-precision binary mask, and its modified type masks, such as a zebra-type mask and a Levenson-type phase shift mask, a novel technique for high-precision processing of a chromium-containing material has been desired. It is necessary to increase the etching rate of a light-shielding film made of a chromium-containing material by a technique different from the conventional one.

The present invention has been made in consideration of the aforementioned problem and its object resides in providing a novel technique that can increase a dry-etching rate of a light-shielding film made of a chromium-containing material while assuring various characteristics, such as optical and chemical characteristics, required for the light-shielding film.

Solution to Problem

To solve the aforementioned problems, the photomask blank according to the present invention includes a light-shielding film having a monolayer structure or a multilayer structure where the light-shielding film is provided on a transparent substrate. Here, the light-shielding film has an optical density of 2 or higher and 4 or lower and has a reflection-preventing function. The light-shielding film includes at least one of layers made of a chromium-containing material, and the at least one of the layers made of a chromium-containing material is made of a chromium-containing material including tin.

Preferably, the chromium-containing material including tin has a content of tin of not under 0.01 times than the content of chromium in atomic ratio and not over 2 times than the content of chromium in atomic ratio.

The light-shielding film may be configured so that all the layers thereof are made of a chromium-containing material.

In this case, all the layers of the light-shielding film may be made of a chromium-containing material containing the tin.

For example, the chromium-containing material is any one of a chromium metal, chromium oxide, chromium nitride, chromium carbide, chromium oxynitride, chromium oxide carbide, chromium nitride carbide, and chromium oxide nitride carbide, and the chromium-containing material including tin is any one of a tin-chromium metal, tin-chromium oxide, tin-chromium nitride, tin-chromium carbide, tin-chromium oxynitride, tin-chromium oxide carbide, tin-chromium nitride carbide, and tin-chromium oxide nitride carbide.

The photomask blank according to the present invention has a hard mask film on the light-shielding film. The hard mask film may be configured to have etching resistance to chlorine-containing dry etching including oxygen.

Preferably, the hard mask film contains silicon, and further contains at least one of nitrogen and oxygen as a light element.

The method for manufacturing a photomask blank according to the present invention is a method for manufacturing a photomask using the above blank to form a light-shielding film pattern. The method includes a step of subjecting the layer made of the chromium-containing material including tin to chlorine-containing dry etching including oxygen.

In the method for manufacturing a phase shift mask according to the present invention, using the light-shielding film pattern obtained by this step as an etching mask, a phase shift film or a transparent substrate provided under the light-shielding film is subjected to fluorine-containing dry etching to carry out pattern transfer on the transparent substrate.

Advantageous Effects of Invention

In the present invention, a light-shielding film formed on a photomask blank is configured as one having a monolayer structure or a multilayer structure, at least one of the layers is a layer made of a chromium-containing material, and at least one of the layers made of a chromium-containing material is made of a chromium-containing material including tin. The layer made of a chromium-containing material including tin can cause a significant increase in the etching rate at the time of chlorine-containing dry etching including oxygen.

Thus, burden on the photoresist pattern or hard mask pattern at the time of transferring a pattern on the light-shielding film is reduced, and therefore it is possible to carry out pattern transfer with high precision. Therefore, since the pattern transfer to the light-shielding film results in high precision patterning, it becomes possible to manufacture a binary mask, a Levenson mask, or the like on which high-precision pattern is formed.

DESCRIPTION OF EMBODIMENTS

Hereinafter, an embodiment of the present invention will be described with reference to drawings.

The term "light-shielding film" may refer to a film having a function of absorbing exposure light in distinction from the term "anti-reflection film" that prevents reflection of light. In this specification, unless otherwise noted, the term "light-shielding film" is used as one that includes the meanings of both terms "light-shielding film" and "anti-reflection film" as mentioned above. In the case that there is a need of distinguishing the term "light-shielding film" and "anti-reflection film" from each other with respect to the above meanings, the term "light-shielding film" responsible for function of absorbing exposure light is referred to as an "light-shielding layer" and the term "anti-reflection film" mainly responsible for function of preventing reflection is referred to as an anti-reflection layer.

As described above, in order to provide a photomask blank in response to the request for further miniaturization and high-precision of lithography technology for formation of photomask pattern in recent years, it is necessary to increase the etching rate of a light-shielding film made of a chromium-containing material by a technique different from the conventional one at the time of carrying out chlorine-containing dry etching including oxygen.

As a result of investigating an increase in dry-etching rate of a chromium-containing material as a light-shielding film material, the present inventors have found out that a dry-etching rate with respect to chlorine-containing dry etching including oxygen can be significantly increased by including tin into a chromium-containing material without a decrease in light-shielding effect, and completed the present invention.

The photomask blank according to the present invention includes a light-shielding film having a monolayer structure or a multilayer structure, the light-shielding film being provided on a transparent substrate. The light-shielding film has an optical density of 2 or higher and 4 or lower and has a reflection-preventing function, the light-shielding film includes at least one of layers made of a chromium-containing material, and the at least one of the layers made of a chromium-containing material is made of a chromium-containing material including tin.

A light-shielding film formed using a layer made of a chromium material is publicly known. For example, Patent Literature 2 discloses a structure in which all the layers of a light-shielding film are made of a chromium-containing material. Furthermore, a structure in which part of a light-shielding film is provided as a layer made of a chromium-containing material (see, for example, Patent Literature 5: JP 2006-146151 A and Patent Literature 6: JP 2006-78807 A). An improvement of the light-shielding film of the present invention is applicable to any of these structures.

In other words, the photomask blank according to the present invention includes a light-shielding film having a monolayer structure or a multilayer structure, the light-shielding film being provided on the transparent substrate, the light-shielding film includes at least one of layers made of a chromium-containing material, and at least one of the layers made of a chromium-containing material is made of a chromium-containing material including tin.

First, the chromium-containing material including tin will be described.

Since a chromium-containing material has comparatively good chemical stability, it has been widely used as an optical film material, especially a light-shielding film material. Since the chromium-containing material has a high resistance against fluorine-containing etching gas, it can be safely used as an etching mask for patterning a silicon-containing material with fluorine-containing dry etching.

For patterning a chromium-containing material film, chlorine-based dry etching is commonly performed. However, chlorine-containing dry etching including oxygen etches a photoresist used for patterning too much to ignore. Thus, there is a limit to make a resist film thin. However, the formation of a fine pattern on the photoresist becomes difficult as the resist film is made thicker. In other words, a measurable film loss of the resist film due to the chlorine-containing dry etching including oxygen makes it difficult to pattern a chromium-containing material film in high precision.

In consideration of such a problem, there is a publicly known method for pattern formation in which a hard mask is formed on a chromium-containing material film and the film is then processed by chlorine-containing dry etching including oxygen. According to this method, the problem of the film loss of the resist film due to chlorine-containing dry etching including oxygen can be solved.

Examples of the material of such a hard mask include silicon-containing materials which can be etched with fluorine-containing dry etching and show etching resistance against chlorine-containing dry etching including oxygen (see, for example, Patent Literature 3). In addition, a material containing oxygen or nitrogen in silicon, a material further containing carbon in such a material, a material containing a transition metal and oxygen or nitrogen in silicon, a material further containing carbon in such a material, and the like are also known (see, for example, Patent Literature 4).

In a method using such a hard mask, first, a hard mask pattern is obtained by transferring a resist pattern on a hard mask film, and a pattern formation is then carried out on a chromium-containing material film by chlorine-containing dry etching including oxygen using such a hard mask pattern.

The use of such a hard mask technology, the problem of burden on the resist pattern at the time of etching the chromium-containing material film. However, since the etching resistance of the above hard mask material against the chlorine-containing dry etching including oxygen is not necessarily enough, there is a limit to make the hard mask into a thin film. In particular, under present circumstances, it is difficult to make an exposure photomask for a circuit having a fine pattern of 20 nm in minimum line width by using the hard mask technology.

Thus, it has been desired to replace the conventional method with a novel method for etching a chromium-containing material film while reducing its burden to a mask pattern.

In the case of forming a chromium-containing material film by sputtering, a high-purity chromium target which is free of any metal impurity is commonly used. In general, this is due to the reasons such as an empirically known fact that a decrease in etching rate of the chromium-containing material film occurs when a metal impurity is mixed into a chromium-containing material film formed by sputtering.

The present inventors have repeatedly performed various examinations on a novel procedure for increasing the dry-etching rate of a film made of a chromium-containing material while assuring design flexibility of the film. As a result, the present inventors have completed the present invention by finding out that, when tin is included in the chromium-containing material film, an increase in etching rate occurs at the time of carrying out chlorine-containing dry etching including oxygen.

In other words, conventionally, film formation of a chromium-containing material film is performed to avoid contamination of metal impurities in the film by using a high-purity chromium-containing target so that the etching rate of the chromium-containing material film is prevented from decreasing. In contrast, based on the above new finding, film formation is performed so that tin is intentionally added to a chromium-containing material film.

According to the investigation of the present inventors, the content (concentration) of tin in a chromium-containing material film is preferably not under 0.01 times, more preferably not under 0.1 times, further preferably not under 0.3 times than the content of chromium in atomic ratio.

A chromium-containing material film where the content of tin is not under 0.01 times than that of chromium in atomic ratio has a significantly increased etching rate under general conditions for chlorine-containing dry etching including oxygen. This effect becomes large as the content of tin increases. The upper limit of the content of tin is not particularly limited. However, an excess content of tin may lead to a difficulty in obtaining a film having substantially the same characteristics as those of a tin-free chromium-containing material. Thus, the content of tin is preferably not over 2 times, more preferably not under 1.5 times than that of chromium in atomic ratio.

At least one layer of layer made of a chromium-containing material is included. Tin at the above concentration is included in at least one of the layers made of a chromium-containing material. That is, there is no need of including tin at the above concentration in all of the layers made of a chromium-containing material, which form a light-shielding film. In practice, however, it is preferred to contain tin at the above concentration in the layers corresponding to 50% or higher of the total layer thickness of the layers made of a chromium-containing material, which form a light-shielding film. The value is more preferably 75% or higher. Needless to say, all the layers of the light-shielding film in a multiple layer structure may be made of a chromium-containing material, and all the layers may contain tin at the above concentration.

The chromium-containing material layers containing tin may be equal in content ratio of tin to chromium, or may be different from one another with respect to a content ratio of tin to chromium. The tin contained in each layer of the light-shielding film does not need to be uniformly distributed in each layer, and may have a profile which has a concentration change in the thickness direction (depth direction) of a layer.

For example, if the upper layer is designed to be a tin-free layer or a layer having a low tin content ratio and the lower layer is designed to be a layer having a high tin content ratio, only the etching rate of the lower layer (on the substrate side) can be increased in contrast to the etching rate of the upper layer (on the surface side). Thus, an over etching time can be set short. On the other hand, when the light-shielding film is designed so that the tin content ratio is lower at the substrate side, it is possible to easily detect the end by monitoring of chromium at the time of dry-etching.

More specifically, for example, in the case that all the layers of the light-shielding film of the present invention are chromium-containing material layers, the content of tin may be not under 0.01 times than the content of chromium in the entire thickness of the light-shielding film. Alternatively, for example, the following variations are applicable: The content of tin in a layer prepared with emphasis on reflection-preventing function may be different from one prepared with emphasis on light-shielding function; only the layer may prepared with emphasis on reflection-preventing function have the content of tin not under 0.01 times than the content of chromium; or in contrast, only the layer may prepared with emphasis on light-shielding function reflection-preventing function have the content of tin not under 0.01 times than the content of chromium.

The above chromium-containing material including tin is any one of chromium compounds, such as a tin-chromium metal, tin-chromium oxide, tin-chromium nitride, tin-chromium carbide, tin-chromium oxynitride, tin-chromium oxide carbide, tin-chromium nitride carbide, and tin-chromium oxide nitride carbide. Among them, tin-chromium nitride, tin-chromium oxynitride, and tin-chromium oxide nitride carbide are particularly preferred.

Examples of a tin-free chromium-containing material include a chromium metal and chromium compounds such as chromium oxide, chromium nitride, chromium carbide, chromium oxynitride, chromium oxide carbide, chromium nitride carbide, and chromium oxide nitride carbide. Among them, chromium nitride, chromium oxynitride, and chromium oxide nitride carbide are particularly preferred.

Although the chromium-containing material layer containing tine of the present invention can be formed according to a publicly known method for forming a typical chromium-containing material layer (see, for example, Patent Literatures 1, 2, 4, and 5), a film excellent in uniformity can be easily obtained using a sputtering method such as DC sputtering or RF sputtering.

When carrying out sputtering film formation of the chromium-containing material layer containing tin of the present invention, a chromium target added with tin (tin-added chromium target) may be used. The chromium target and the in target may be independently provided to carry out co-sputtering (simultaneous sputtering). Alternatively, a complex target having a chromium region and a tin region in a single target may be used. Furthermore, co-sputtering may be carried out using both the above complex target and the chromium target.

In the case of adding tin to the chromium target, it may be added as a metal tin or may be added as a tin compound such as tin oxide, tin nitride, or ITO.

In the case of carrying out co-sputtering using both a tin-containing target and a tin-free target, the concentration of tin in an inorganic material film can be adjusted no only by controlling the surface area ratios of the respective targets but also by controlling electric power to be applied to each target.

Particularly, if there is a need of changing the ratio of chromium between the chromium-containing material including tin layers or a need of gradual change in ratio of chromium to tin in a single layer, co-sputtering is carried out using a combination of a tin-containing target and a tin-free target or a combination of targets with different tin contents to change an applied power ratio between the targets. As a result, layers with different desired tin content ratios can be formed.

The sputtering gas used in film formation of the light-shielding film of the present invention is suitably selected according to the composition of the film. In order to adjust an optical concentration, the use of reactive sputtering with sputtering gas and the addition of one or more elements selected from oxygen, nitrogen, and carbon are performed just as in the case with the film-formation of a publicly known chromium-containing material layer.

For example, only argon gas may be used when the film-formation of a tin-containing inorganic material film that does not contain a light element is performed. In the case of film-formation of an inorganic material film containing a light element, reactive sputtering may be carried out in one or more kinds of reactive gas, such as nitrogen gas, nitrogen oxide gas, oxygen gas, or carbon oxide gas, or mixture gas of any of those reactive gas and inert gas such as argon.

Furthermore, in the case of designing a light-shielding film having a chromium-containing material layer containing tin, the amount of a light element added may be found within in the rage used for designing a publicly known chromium-containing material layer.

The flow rate of sputtering gas is adjusted suitably. The gas flow rate may be constant in the process of film-formation. Alternatively, the gas flow rate may be changed according to the target composition when there is a need of changing the amount of oxygen or the amount of nitrogen in a thickness direction.

The above layer made of a chromium-containing material including tin may be substantially applicable without modification to a publicly known light-shielding film having a structure including a layer made of a chromium-containing material as a structural element.

In this case, the publicly known chromium-containing material layer having a multiple layer structure may be replaced with the above chromium-containing material layer of the present invention. All the layers of the light-shielding film may be replaced with the chromium-containing material layer.

Hereinafter, the design of the light-shielding film of the present invention will be briefly described.

When using as a photomask the light-shielding film provided on a transparent substrate, it has a function which shades exposure light substantially in a pattern formation part, and prevents sensitization of photoresist membrane.

Thus, in general, materials and film thickness are designed so that the optical density thereof against the exposure light can be 2 or higher, preferably 2.5 or higher when used as a mask. In general, the optical density is designed so as to be 4.0 or lower because an optical density of 4.0 or higher leads to an undesired over reflection-preventing function.

In the case of providing a layer having reflection-preventing function on the surface side of a transparent substrate, the optical density and film thickness of the reflection-preventing function layer are also desired so as to be desired values, respectively. The reflectance to exposure light is preferably designed to 25% or less 35% or less, for example.

Such a light-shielding film is provided as a multilayer structure and all the layers of the light-shielding film are made of a chromium-containing material. For example, when the layers made of the above chromium-containing material containing occupy 50% or higher of the entire thickness of the light-shielding film, the etching rate of the film can be significantly increased under the conditions for chlorine-containing dry etching containing oxygen as compared with a light-shielding film including only layers made of a tin-free chromium-containing material. Thus, the etching time can be shortened.

Preferably, the layers made of a chromium-containing material including tin make up 75% or higher of the light-shielding film. In particular, when all the layers are those made of a chromium-containing material including tin, an effect of shortening the above etching time can be remarkably achieved. Such an effect of shortening the etching time allows the light-shielding film to reduce damage of a resist pattern to be received in process of etching the light-shielding film. As a result, a high-precision light-shielding film pattern can be obtained.

On the other hand, the etching resistance of the chromium-containing material film containing tin under the conditions for fluorine-containing dry etching is equal to or higher than the etching resistance of the tin-free chromium-containing material.

In the case of patterning a light-shielding film including a chromium-containing material layer on the surface side and other layers, silicon-containing material layers, first, the chromium-containing material layer containing tin on the upper side is processed by chlorine-containing dry etching including oxygen to reduce burden on a resist pattern, and the patterned chromium-containing material layer containing tin is then used as a hard mask to carry out fluorine-containing dry etching of the silicon-containing material layer on the lower side.

In the photomask blank of the present invention, a hard mask film may be provided on the upper side of the light-shielding film, or on the side thereof opposite to the transparent substrate, the hard mask being configured to have etching resistance to chlorine-containing dry etching including oxygen while being possible to be processed by fluorine-containing dry etching or chlorine-containing dry etching including oxygen.

Materials for such a hard mask are described in Patent Literature 4 in detail, specifically, the materials including a tantalum compound, a hafnium compound, a silicon-containing material containing a transition metal, and a silicon-containing material free of a transition metal. From a view point of processability, a silicon-containing material free of a transition metal or a silicon-containing material containing a transition metal are preferred.

Examples of the transition metal contained in the silicon-containing meal include tungsten, molybdenum, titanium, tantalum, zirconium, hafnium, niobium, vanadium, cobalt, and nickel. Among them, one containing molybdenum is preferred from a viewpoint of processing characteristics.

Examples of the silicon-containing material containing molybdenum include molybdenum silicide oxide (MoSiO), a molybdenum silicide nitride (MoSiN), molybdenum silicide carbide (MoSiC), a molybdenum silicide oxynitride (MoSiON), molybdenum silicide oxide carbide (MoSiO), a molybdenum silicide nitride carbide (MoSiN), and molybdenum silicide oxide nitride carbide (MoSiONC).

Examples of the silicon-containing material free of a transition metal include silicon oxide, silicon nitride, silicon oxynitride, silicon oxide carbide, silicon carbide nitride, and silicon carbide oxide nitride.

Patent Literature 4 (JP 2009-80510 A) illustrates that a light-shielding film made of a chromium-containing material in which all the layers are free of tin is processed using a hard mask film made of a silicon-containing material. The hard mask film is formed comparatively thick as much as a thickness of 90 nm or higher.

Like the present invention, on the other hand, in the case of a light-shielding film including as a structural component a layer made of a chromium-containing material including tin, a hard mask film has an enough thickness of 50 nm or lower, and there is no problem occurred in practice even if he thickness of the hard mask film is 20 nm or lower. Even if it is less than 10 nm or lower, the light-shielding film can be processed.

Furthermore, the lower limit of the thickness of such a hard mask film depends on, for example, the thickness of the light-shielding film. However, if it is lower than 1 nm, sufficient processing accuracy may be not secured.

The configuration of the hard mask film is not restricted to one that can be removed after processing a light-shielding film. As disclosed in Patent Literature 5, a hard mask film may be formed in a light-shielding film that is configured such that a silicon-containing material is provided on the surface side of the light-shielding film and a chromium-containing material is provided on the substrate side thereof.

In this kind of the light-shielding film, the silicon-containing material layer on the surface side thereof is processed by fluorine-containing dry etching. A silicon-containing material pattern thus obtained is used as a hard mask pattern. In other words, the silicon-containing material layer provided as a part of the light-shielding film is also functioned as a "hard mask film". Furthermore, using such a silicon-containing material pattern as a mask, the chromium-containing material layer is processed by chlorine-containing dry etching including oxygen. At this time, when the chromium-containing material layer contains tin, an etching time can be shortened.

As described above, by employing a chromium-containing material including tin as a light-shielding film or the like, an increase in etching rate at the time of chlorine-containing dry etching including oxygen can be achieved. In addition, sufficient etching resistance to conditions for fluorine-containing dry etching can be secured. As a result, it becomes processable in high precision.

A process for manufacturing a binary mask using a photomask blank including as a structural component a film made of a chromium-containing material is publicly known (see, for example, patent documents 2 to 6). Hereinafter, the respective steps will be briefly described by typical example.

A layer made of a chromium-containing material including tin can be dry-etched with chlorine gas containing oxygen in a manner similar to a layer made of a chromium-containing material free of tin, and it shows a significantly high etching rate as compared with the layer made of a chromium-containing material free of tin under the same conditions.

Dry-etching on the layer made of a chromium-containing material including tin can be carried out, for example, using gas of chlorine gas and oxygen gas at a mixture ratio ($Cl_2$ gas: $O_2$ gas) of 1:2 to 20:1 in terms of volumetric flow rate, and optionally mixed with inert gas such as helium.

When a layer made of a chromium-containing material including tin as an etching mask is used as an etching mask and a film under such a layer is then processed by fluorine-containing dry etching, for example, gas containing fluorine can be used. Examples of the gas containing fluorine include fluorine gas, gas containing carbon and fluorine (such as $CF_4$ and $C_2F_6$), and gas containing sulfur and fluorine (such as $SF_6$). Furthermore, these kinds of gas containing fluorine can be mixed with fluorine-free gas, such as helium, and used. The etching gas may be added with gas of oxygen or the like if required.

Figure 1:
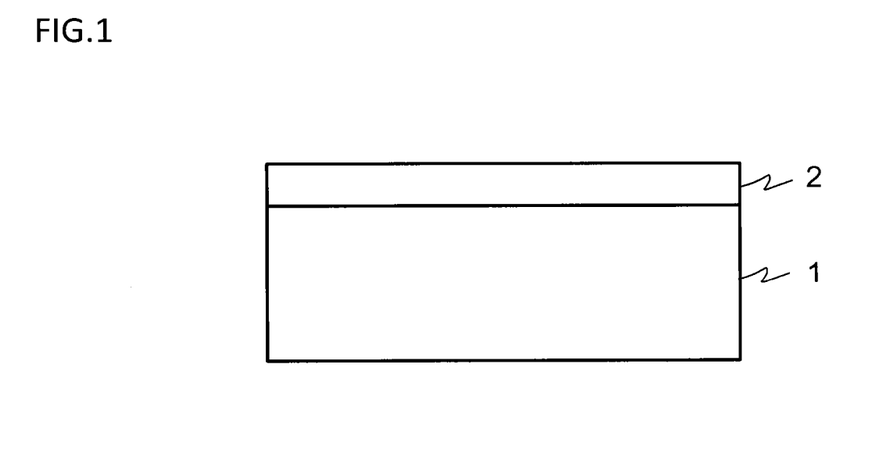
FIG. 1 is a cross-sectional diagram illustrating the configuration of a photomask blank according to an embodiment of the present invention.
Figure 2:
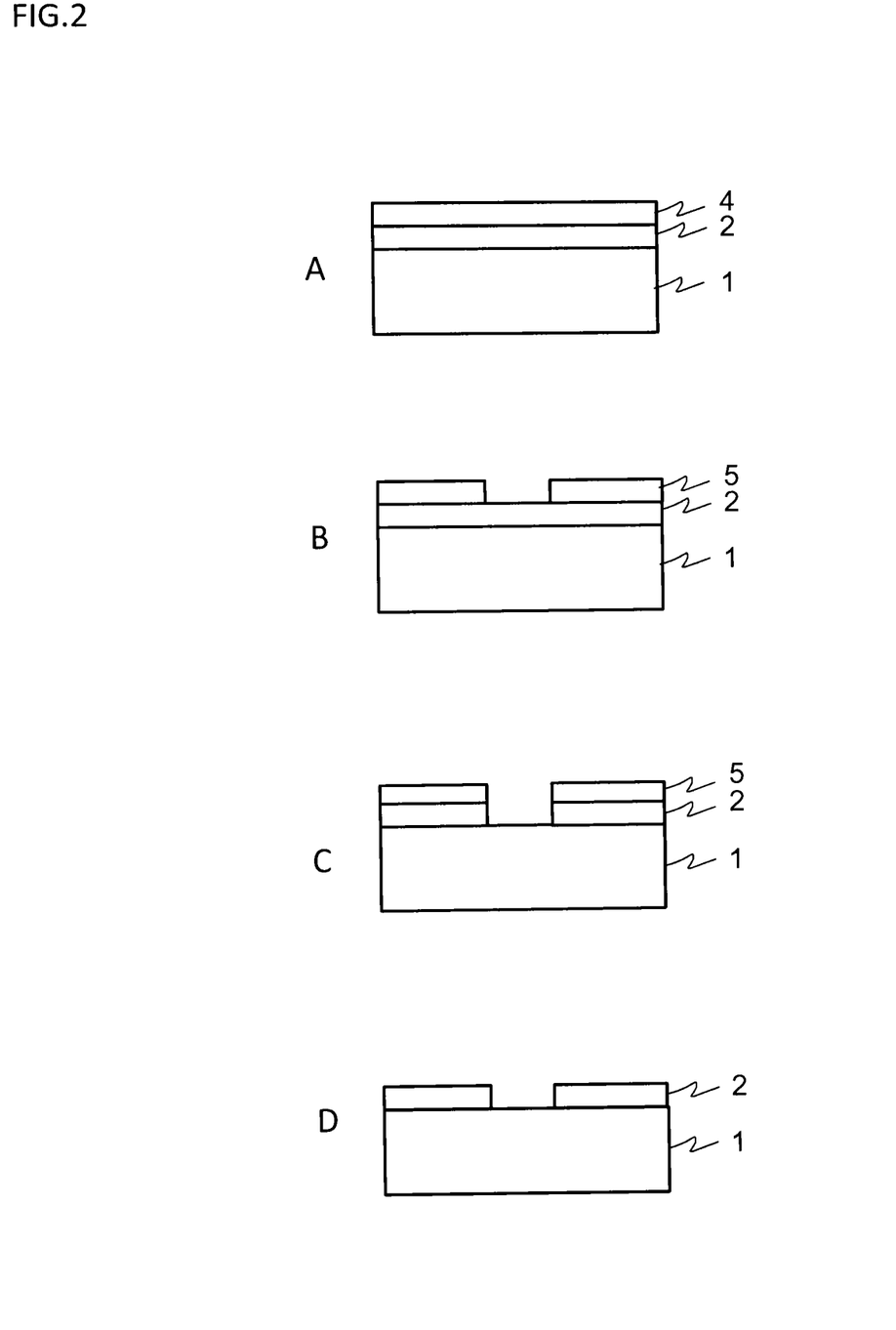
FIG. 2 is a diagram illustrating a process for manufacturing a binary mask according to an embodiment of the present invention.

FIG. 1 is a cross-sectional diagram illustrating the configuration of a photomask blank according to an embodiment of the present invention. In the embodiment illustrated in the figure, a light-shielding film 2 is formed on transparent substrate 1. The whole light-shielding film 2 is made of a chromium-containing material including tin. A process for manufacturing a binary mask using such a blank can be outlined as follows:

FIG. 2 is a diagram illustrating an embodiment of a process for manufacturing a binary mask. First, to the light-shielding film 2 of the photomask blank illustrated in the FIG. 1, a photoresist is applied to form a resist film 4 (FIG. 2A).

Next, in order to carry out patterning to obtain a resist pattern for to carry out patterning for protecting the portion of the light-shielding film 2 to leave it untouched, electron beams are irradiated in pattern on the resist film 4. After subsequent steps of development and so on, a resist pattern 5 is obtained (FIG. 2A).

Using this resist pattern 5 as a mask, the light-shielding film 2 is patterned by chlorine-containing dry etching including oxygen (FIG. 2C). At this time, the light-shielding film 2 made of a chromium-containing material including tin has a high etching rate. Thus, an etching time is shortened to reduce damage of the resist pattern 5. As a result, it is high-precision pattern transfer can be carried out.

The remaining resist pattern 5 is removed by dry etching. As a result, a binary mask is completed (FIG. 2D).

A Levenson type mask is also producible using the blank illustrated in the FIG. 1. Here, a type of engraving the transparent substrate by etching will be described below. Alternatively, instead of engraving the transparent substrate, a substrate on which a transparent phase shift film such as a silicon oxide film may be used as a substrate and the phase shift film may be then etched.

Figure 3:
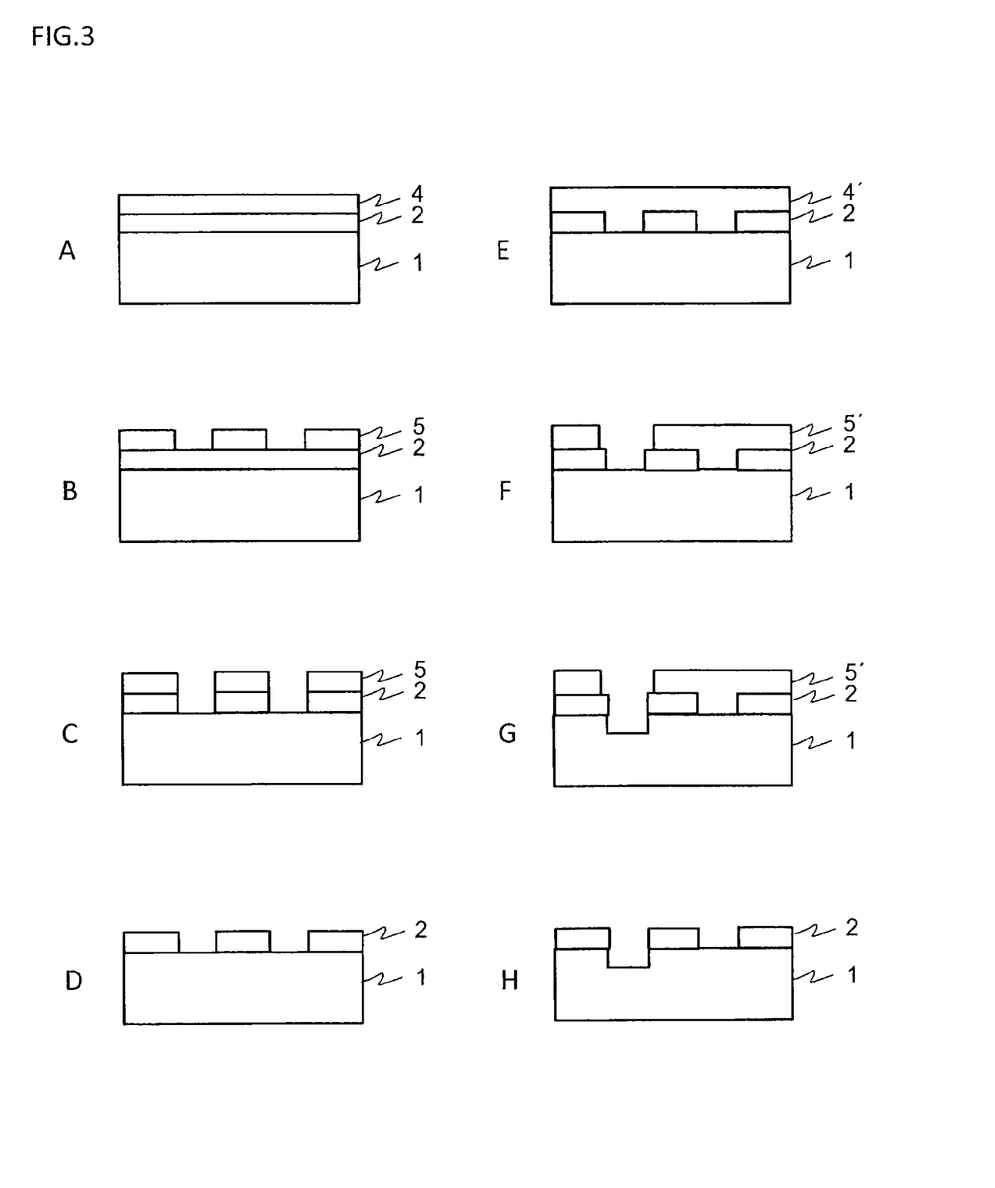
FIG. 3 is a diagram illustrating a process for manufacturing a Levenson type mask according to an embodiment of the present invention.

FIG. 3 is an embodiment of a process for manufacturing a Levenson type mask. First, to the light-shielding film 2 of the photomask blank illustrated in FIG. 1, a photoresist is applied to form a resist film 4 (FIG. 3A).

Next, in order to carry out patterning to obtain a resist pattern having an opening corresponding to a removal portion of the light-shielding film 2, electron beams are irradiated in pattern on the resist film 4. After subsequent steps of development and so on, a resist pattern 5 is obtained (FIG. 3B).

Using this resist pattern 5 as a mask, the light-shielding film 2 is patterned by chlorine-containing dry etching including oxygen (FIG. 3C). At this time, the light-shielding film 2 made of a chromium-containing material including tin has a high etching rate. Thus, an etching time is shortened to reduce damage of the resist pattern 5. As a result, it is high-precision pattern transfer can be carried out.

The remaining resist pattern 5 is removed by dry etching (FIG. 3D), and additional photoresist is then applied to form a resist film 4' (FIG. 3E).

The resist film 4' is subjected to pattern irradiation of electron beams, and the subjected to predetermined steps of development and so on. As result, a resist pattern 5' having an opening around a engraving target portion of the transparent substrate 1 was obtained (FIG. 3F). The resist pattern 5' in this case is formed so that the engraving target portion can be completely exposed. The end portion of the light-shielding film 2 may be exposed. This is because the light-shielding film 2 made of a chromium-containing material including tin has a sufficiently high etching resistance to fluorine-containing dry etching.

Subsequently, fluorine-containing dry etching is carried out to etch the engraving target portion of the transparent substrate 1 by a predetermined depth. In this case, the engraving is carried out so that the engraved portion has a depth that makes a phase difference of approximately 180 degrees of exposure light with respect to a portion where the transparent substrate is not exposed and engraved (FIG. 3G).

The remaining resist pattern 5' is removed by dry etching. As a result, a Levenson type mask is completed (FIG. 3H).

Figure 4:
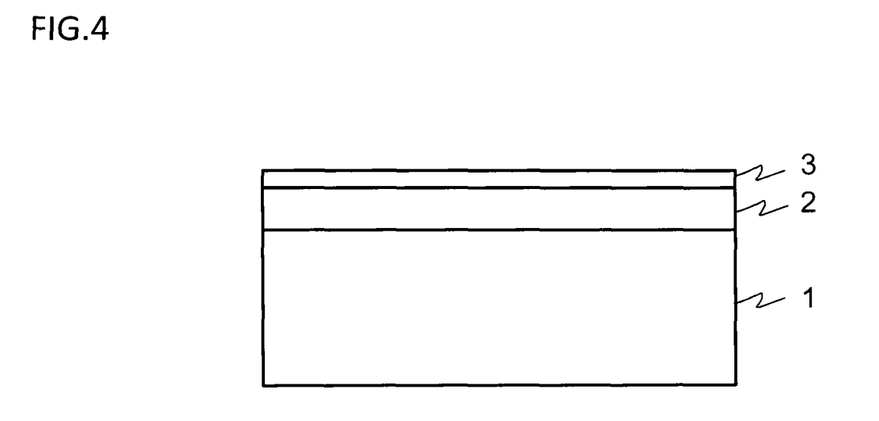
FIG. 4 is a cross-sectional diagram illustrating the configuration of a photomask blank according to another embodiment of the present invention.

FIG. 4 is a cross-sectional diagram illustrating the configuration of a photomask blank according to another embodiment of the present invention. In the embodiment illustrated in the figure, on a light-shielding film 1, a light-shielding film 2 and a hard mask film 3 for etching a chromium-containing material are formed. The whole light-shielding film 2 is formed by film-formation with a chromium-containing material including tin.

Furthermore, the hard mask film 3 is a film that can be etched under the conditions for fluorine-containing dry etching and resist etching with chlorine-containing dry etching including oxygen. For example, the hard mask film 3 contains silicon and further containing at least one of nitrogen and oxygen as a light element. An example of such a material is a silicon oxide.

Figure 5:
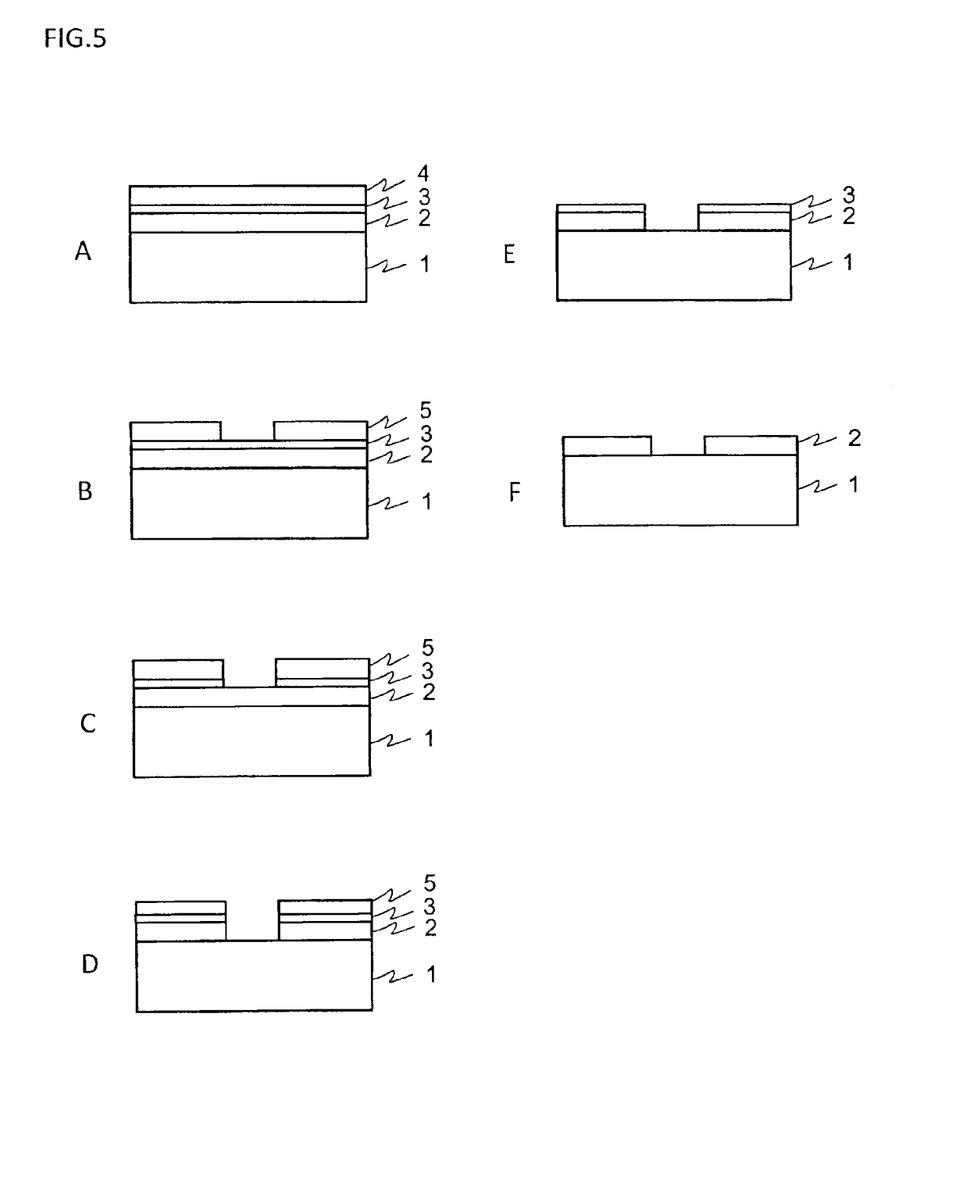
FIG. 5 is a diagram illustrating another embodiment of a process for manufacturing a binary mask.

A process for manufacturing a binary mask using such a blank can be outlined as follows:

FIG. 5 is a diagram illustrating another embodiment of a process for manufacturing a binary mask. First, to the hard mask film 3 of the photomask blank illustrated in the FIG. 4, a photoresist is applied to form a resist film 4 (FIG. 5A).

Next, in order to carry out patterning to obtain a resist pattern for protecting a portion of the light-shielding film 2 to be left untouched, electron beams are irradiated in pattern on the resist film 4. After subsequent steps of development and so on, a resist pattern 5 is obtained (FIG. 5B).

Using this resist pattern 5 as a mask, the hard mask film 3 is patterned by fluorine-containing dry etching (FIG. 5C). At this time, a high etching rate is obtained at the time of carrying out chlorine-containing dry etching including oxygen on the light-shielding film 2 made of a chromium-containing material including tin. Thus, the thickness of the hard mask film 3 can be made thin as compared with the conventional one. As a result, high-precision pattern transfer becomes possible.

Subsequently, using the patterned hard mask film 2 as a mask, the light-shielding film 3 is patterned by chlorine-containing dry etching including oxygen (FIG. 5D).

The remaining resist pattern 5 is removed by dry etching (FIG. 5E). After removal of the hard mask film 3 by fluorine-containing dry etching, a binary mask is completed (FIG. 5F).

A Levenson type mask is also producible using the blank illustrated in FIG. 4.

Figure 6:
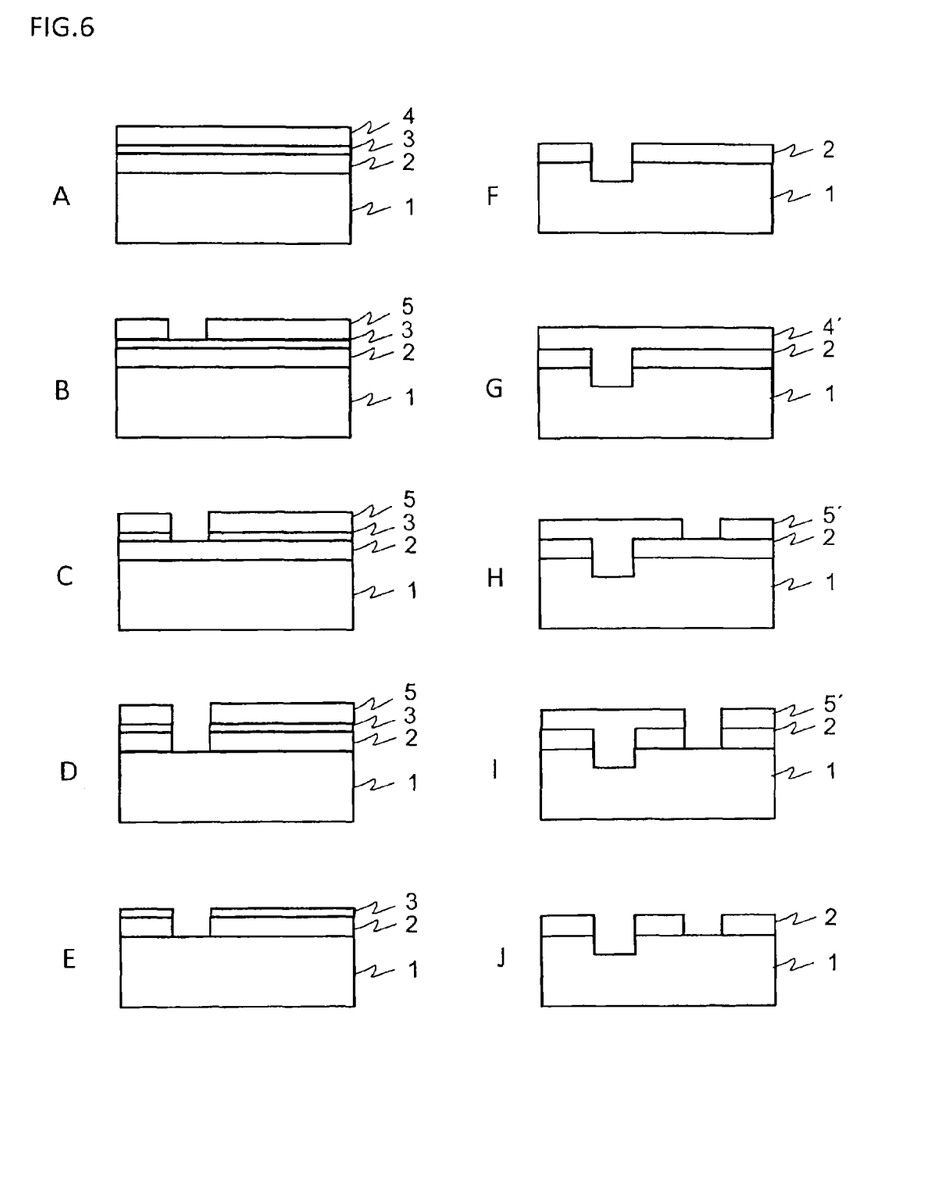
FIG. 6 is a diagram illustrating another embodiment of a process for manufacturing a Levenson type mask.

FIG. 6 is an embodiment of a process for manufacturing another Levenson type mask. In this example, to avoid an increase in number of steps, removal of hard mask film 3 and a carve lump of transparent substrate 1 are performed simultaneously, and it is considered as the mode which does not increase the number of etching processes.

First, to the hard mask film 3 of the photomask blank illustrated in the FIG. 4, a photoresist is applied to form a resist film 4 (FIG. 6A).

Subsequently, a resist pattern 5 having an opening around a engraving target portion of the transparent substrate 1 (FIG. 6B).

Using this resist pattern 5 as a mask, the hard mask film 3 is patterned by fluorine-containing dry etching (FIG. 6C). At this time, a high etching rate is obtained at the time of carrying out chlorine-containing dry etching including oxygen on the light-shielding film 2 made of a chromium-containing material including tin. Thus, the thickness of the hard mask film 3 can be made thin as compared with the conventional one. As a result, high-precision pattern transfer becomes possible.

Subsequently, using the patterned hard mask film 3 as a mask, the light-shielding film 2 is patterned by chlorine-containing dry etching including oxygen (FIG. 6D).

The remaining resist pattern 5 is removed by dry etching (FIG. 6E).

Subsequently, fluorine-containing dry etching is carried out to etch the engraving target portion of the transparent substrate 1 by a predetermined depth. In this case, the engraving is carried out so that the engraved portion has a depth that makes a phase difference of approximately 180 degrees of exposure light with respect to a portion where the transparent substrate is not exposed and engraved (FIG. 6F). The hard mask film 3 is also removed by this fluorine-containing dry etching.

Additive photoresist is applied to form a resist film 4' (FIG. 6G). The resist film 4' is subjected to pattern irradiation of electron beams, and the subjected to predetermined steps of development and so on. As result, a resist pattern 5' having an opening around a engraving target portion where the light-shielding film 2 is desired to be removed (FIG. 6H).

Subsequently, using this resist pattern 5' as a mask, the light-shielding film 2 is patterned by chlorine-containing dry etching including oxygen (FIG. 6I).

The remaining resist pattern 5' is removed by dry etching. As a result, a Levenson type mask is completed (FIG. 6J).

[Evaluation Experiment Dry-etching Characteristics]

As an example of an experiment for evaluating dry-etching characteristics, film formation was performed on a square-shaped quartz substrate of 152 mm on a side and 6 mm in thickness by a DC sputtering method using co-sputtering with a chromium target and a tin target which were independently disposed to obtain two different 44-nm thick CrON films with different tin concentration.

The content of tin in the CrON film was adjusted by adjusting power individually applied to the chromium target and the tin target. Sputtering gas was a gas mixture of argon gas, oxygen gas, and nitrogen gas.

For comparison, furthermore, a tin-free CrON film was also formed using a Cr target.

Two or more of each of the above three samples of the chromium-containing material films were produced. The composition analysis of the chromium-containing material films was carried out using ESCA (JPS-9000MC, manufactured by JEOL).

These samples were compared with one another with respect to an etching rate (clear time) of a 44-nm thick chromium-containing film with chlorine-containing dry etching including oxygen.

Figure 7:
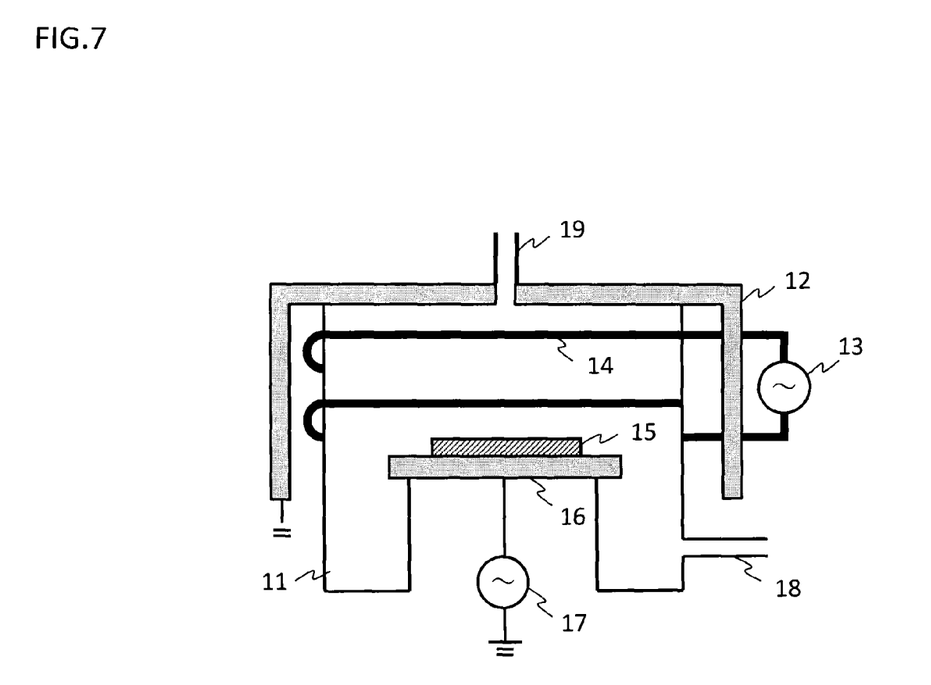
FIG. 7 is a diagram schematically illustrating the configuration of a device used for dry-etching.

FIG. 7 is a diagram schematically illustrating the configuration of a device used for chlorine-containing dry etching including oxygen. In the figure, reference numeral 11 denotes a chamber, 12 denotes a counter electrode, 13 denotes a high frequency oscillator for inductively coupled plasma (ICP), 14 denotes an antenna coil, 15 denotes a sample, 16 denotes a flat electrode, 17 denotes a RIE high frequency oscillator, 18 denotes an exhaust opening, and 19 denotes a gas inlet. FIG. 5 also serves as a diagram schematically illustrating the configuration of a device used for fluorine-containing dry etching as described below.

Dry-etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to an ICP-generation high frequency oscillator 13.

Clear times of the respective samples of Example 1, Example 2, and Comparative Example when chlorine-containing dry etching including oxygen was carried out under the above conditions were obtained from reflectance measurements on these samples. The results are shown in Table 1. Here, the clear times are represented by a value relative to the clear time of a sample in Comparative Example defined as 1.

TABLE 1

| Sample | Sn/Cr (mol/mol) | Clear time (Relative value) |
|---|---|---|
| Example 1 | 0.19 | 0.63 |
| Example 2 | 0.11 | 0.85 |
| Comparative Example | 0.0 | 1 |

As is evident from the above results, the samples of Examples 1 and 2, which contains tin in a CrON film showed an increase in etching rate at the time of chlorine-containing dry etching including oxygen as compared with the sample of Comparative Example, which does not contain Sn.

These samples were compared with one another with respect to the dry-etching rate (clear time) of the CrON film of 44 nm in film thickness. The above etching was carried out under the following conditions: The inner pressure of the chamber was set to 5 mTorr, $SF_6$ (18 sccm) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Clear times of the respective samples of Example 1, Example 2, and Comparative Example when fluorine-containing dry etching was carried out under the above conditions were obtained from reflectance measurements on these samples. The results are shown in Table 2. Then, the ratio of clear time of the fluorine-containing dry etching to the clear time of the chlorine-containing dry-etching containing oxygen.

TABLE 2

| Sample | Sn/Cr (mol/mol) | Clear time ratio |
|---|---|---|
| Example 1 | 0.19 | 13.6 |
| Example 2 | 0.11 | 11.1 |
| Example | 0 | 10.3 |

As is evident from the above results. In each of the samples of Examples 1 and 2, which contain tin in the CrON film, in comparison with the sample of Comparative Example, which does not contain Sn, there is an increase in ratio of clear time of the fluorine-containing dry etching to the clear time of the chlorine-containing dry-etching containing oxygen. Specifically, the ratio between the clear time of the chlorine-containing dry etching including oxygen and the clear time of the fluorine-containing dry etching is 1:11.

EXAMPLES

Example 1

A light-shielding film including a light-shielding layer and an anti-reflection layer was formed on a quartz substrate by using a direct-current sputtering device. As a light-shielding layer, a film (46 nm in film thickness) made of chromium, tin, and nitrogen was formed on the quartz substrate.

Using two different targets, a chromium target and a tin target, as targets, film-formation was carried out on the quartz substrate in rotation at 30 rpm. Sputtering gas used was Ar and nitrogen and adjusted so that the inside of a gas chamber could have a gas pressure of 0.05 Pa.

When the composition of this light-shielding layer was investigated by ESCA, it was Cr:Sn:N=6:1:2 (atomic ratio).

On the light-shielding layer, film-formation of an anti-reflection layer (23 nm in film thickness) made of chromium, tin, nitrogen, and oxygen was carried out by using a direct-current sputtering device.

Using two different targets, a chromium target and a tin target, as targets, film-formation was carried out on the quartz substrate in rotation at 30 rpm. Sputtering gas used was nitrogen and oxygen and adjusted so that the inside of a gas chamber could have a gas pressure of 0.1 Pa.

When the composition of this anti-reflection layer was investigated by ESCA, it was Cr:Sn:N:O=5:1:2:5 (atomic ratio).

Consequently, there was obtained a photomask blank where the light-shielding layer made of CrSnN and an anti-reflection layer made of CrSnON are stacked as a light-shielding film on the quarts substrate.

Subsequently, chemical amplification negative resist was applied 250 nm in thickness, and then subjected to exposure and development to carry out patterning. Next, using this resist pattern as a mask, dry-etching was carried out with mixture gas of chlorine and oxygen to pattern the light-shielding film.

Dry etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to an ICP-generation high frequency oscillator 13.

Finally, the resist was removed. As a result, a binary mask was completed.

[Embodiment 2]

A light-shielding film including a light-shielding layer and an anti-reflection layer was formed on a quartz substrate by using a direct-current sputtering device. As a light-shielding layer, a film (46 nm in film thickness) made of chromium, tin, and nitrogen was formed on the quartz substrate.

Using two different targets, a chromium target and a tin target, as targets, film-formation was carried out on the quartz substrate in rotation at 30 rpm. Sputtering gas used was Ar and nitrogen and adjusted so that the inside of a gas chamber could have a gas pressure of 0.05 Pa.

When the composition of this light-shielding layer was investigated by ESCA, it was Cr:Sn:N=6:1:2 (atomic ratio).

On the light-shielding layer, film-formation of an anti-reflection layer (23 nm in film thickness) made of chromium, tin, and nitrogen was carried out by using a direct-current sputtering device.

Using two different targets, a chromium target and a tin target, as targets, film-formation was carried out on the quartz substrate in rotation at 30 rpm. Sputtering gas used was nitrogen and oxygen and adjusted so that the inside of a gas chamber could have a gas pressure of 0.1 Pa.

When the composition of this anti-reflection layer was investigated by ESCA, it was Cr:Sn:N:O=5:1:2:5 (atomic ratio).

Using a direct sputtering device, a hard mask film (20 nm in film thickness) was formed on the anti-reflection layer.

Using a Si target as a target, film-formation was carried out on the quartz substrate in rotation at 30 rpm. Sputtering gas used was Ar and oxygen and adjusted so that the inside of a gas chamber could have a gas pressure of 0.1 Pa.

Consequently, there was obtained a photomask blank where the light-shielding layer made of CrSnN and an anti-reflection layer made of CrSnON as a light-shielding film, and a film made of SiO as a hard mask film are stacked on the quarts substrate.

Subsequently, chemical amplification negative resist was applied 150 nm in thickness, and then subjected to exposure and development to carry out patterning. Next, using this resist pattern as a mask, dry-etching was carried out with fluorine gas to pattern the hard mask film.

The above etching was carried out under the following conditions: The inner pressure of the chamber was set to 5 mTorr, $SF_6$ (185 sccm) and $O_2$ (45 sccm) were supplied as etching gas, a voltage of 54 V (continuous discharge) was applied to the RIE high frequency oscillator, and a power of 325 W (continuous discharge) was supplied to the ICP-generation high frequency oscillator 13.

Next, dry-etching was carried out using mixture gas of chlorine and oxygen as etching gas to pattern the light-shielding film.

The above etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Finally, the resist was removed. As a result, a binary mask was completed.

Example 3

A light-shielding film including a light-shielding layer and an anti-reflection layer was formed on a quartz substrate by using a direct-current sputtering device. As a light-shielding layer, a film (46 nm in film thickness) made of chromium, tin, and nitrogen was formed on the quartz substrate.

Using two different targets, a chromium target and a tin target, as targets, film-formation was carried out on the quartz substrate in rotation at 30 rpm. Sputtering gas used was Ar and nitrogen and adjusted so that the inside of a gas chamber could have a gas pressure of 0.05 Pa.

When the composition of this light-shielding film was investigated by ESCA, it was Cr:Sn:N=6:1:2 (atomic ratio).

On the light-shielding layer, film-formation of an anti-reflection layer (23 nm in film thickness) made of chromium, tin, nitrogen, and oxygen was carried out by using a direct-current sputtering device.

Using two different targets, a chromium target and a tin target, as targets, film-formation was carried out on the quartz substrate in rotation at 30 rpm. Sputtering gas used was nitrogen and oxygen and adjusted so that the inside of a gas chamber could have a gas pressure of 0.1 Pa.

When the composition of this anti-reflection layer was investigated by ESCA, it was Cr:Sn:N:O=5:1:2:5 (atomic ratio).

Consequently, there was obtained a photomask blank where the light-shielding layer made of CrSnN and an anti-reflection layer made of CrSnON are stacked as a light-shielding film on the quarts substrate.

Subsequently, chemical amplification negative resist was applied 150 nm in thickness, and then subjected to exposure and development to carry out patterning. Next, using this resist pattern as a mask, dry-etching was carried out with mixture gas of chlorine and oxygen as etching gas to pattern the light-shielding film.

The above etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Subsequently, a second resist film (EB resist film) was applied, and then exposed and developed to form a second resist pattern having an opening at a portion where a quartz substrate was etched.

Using the second resist pattern and the above patterned light-shielding film as masks, dry etching was performed with fluorine gas to form an engraving portion of 170 nm in depth in the quartz substrate.

Finally, the resist was removed. As a result, a Levenson type phase shift mask was completed.

As described above, in the present invention, a light-shielding film formed on a photomask blank is configured as one having a monolayer structure or a multilayer structure, at least one of the layers is a layer made of a chromium-containing material, and at least one of the layers made of a chromium-containing material is made of a chromium-containing material including tin.

The layer made of a chromium-containing material including tin can cause a significant increase in the etching rate at the time of chlorine-containing dry etching including oxygen.

Thus, burden on the resist pattern or hard mask pattern at the time of transferring a pattern on the light-shielding film is reduced, and therefore it is possible to carry out pattern transfer with high precision.

INDUSTRIAL APPLICABILITY

The present invention provides a novel technique that can increase a dry-etching rate of a light-shielding film made of a chromium-containing material while assuring various characteristics, such as optical and chemical characteristics, required for the light-shielding film.

REFERENCE SIGNS LIST

1 Transparent substrate
2 Light-shielding film
3 Hard mask film
4 Resist film
5 Resist pattern
11 Chamber
12 Counter electrode
13 High frequency oscillator for ICP development
14 Antenna coil
15 Sample
16 Flat electrode
17 High frequency oscillator for RIE
18 Exhaust opening
19 Gas inlet

The invention claimed is:
1. A photomask blank, comprising:
a light-shielding film having a monolayer structure or a multilayer structure provided on a transparent substrate, wherein said light-shielding film has an optical density of 2 or higher and 4 or lower and has a reflection-preventing function,
said light-shielding film comprises at least one layer made of a chromium-containing material, and said at least one layer made of a chromium-containing material is made of a chromium-containing material including tin.

2. The photomask blank according to claim 1, wherein said chromium-containing material including tin has a content of tin of not under 0.01 times and not over 2 times than the content of chromium in atomic ratio.

3. The photomask blank according to claim 1, wherein all the layers of the light-shielding film are made of a chromium-containing material.

4. The photomask blank according to claim 3, wherein all the layers of the light-shielding film are made of a chromium-containing material containing the tin.

5. The photomask blank according to claim 1, wherein said chromium-containing material is any one of a chromium metal, chromium oxide, chromium nitride, chromium carbide, chromium oxynitride, chromium oxide carbide, chromium nitride carbide, or chromium oxide nitride carbide, and said chromium-containing material including tin is any one of a tin-chromium metal, tin-chromium oxide, tin-chromium nitride, tin-chromium carbide, tin-chromium oxynitride, tin-chromium oxide carbide, tin-chromium nitride carbide, or tin-chromium oxide nitride carbide.

6. The photomask blank according to claim 1, further comprising:
a hard mask film on said light-shielding film, wherein said hard mask film has etching resistance to chlorine-containing dry etching including oxygen.

7. The photomask blank according to claim 6, wherein said hard mask film contains silicon, and further contains at least one of nitrogen and oxygen as a light element.

8. A method for manufacturing a photomask, said method comprising:
subjecting said layer made of said chromium-containing material including tin in a photomask blank according to claim 1 to chlorine-containing dry etching including oxygen to form a light-shielding film pattern.

9. A method for manufacturing a phase shift mask, said method comprising:
subjecting said layer made of said chromium-containing material including tin in a photomask blank according claim 1 to chlorine-containing dry etching including oxygen to form a light-shielding film pattern, and
using said light-shielding film pattern as an etching mask, subjecting a phase shift film or a transparent substrate provided under the light-shielding film to fluorine-containing dry etching to carry out pattern transfer on the transparent substrate.

* * * * *